United States Patent
Kuo et al.

(10) Patent No.: US 8,717,813 B2
(45) Date of Patent: May 6, 2014

(54) METHOD AND APPARATUS FOR LEAKAGE SUPPRESSION IN FLASH MEMORY IN RESPONSE TO EXTERNAL COMMANDS

(75) Inventors: Nai-Ping Kuo, Hsinchu (TW);
Su-Chueh Lo, Hsinchu (TW);
Kuen-Long Chang, Taipei (TW);
Chun-Hsiung Hung, Hsinchu (TW);
Chia-Feng Cheng, Changhua (TW);
Ken-Hui Chen, Hsinchu (TW);
Yu-Chen Wang, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 85 days.

(21) Appl. No.: 13/308,266

(22) Filed: Nov. 30, 2011

(65) Prior Publication Data

US 2012/0262987 A1     Oct. 18, 2012

Related U.S. Application Data

(60) Provisional application No. 61/475,157, filed on Apr. 13, 2011.

(51) Int. Cl.
*G11C 11/34*     (2006.01)

(52) U.S. Cl.
USPC ............ 365/185.03; 365/185.11; 365/185.17; 365/185.18; 365/185.24; 365/185.29; 365/185.3; 365/185.33

(58) Field of Classification Search
USPC ............. 365/185.17, 185.18, 185.21, 185.24, 365/185.28, 185.29, 185.3, 185.33, 185.03, 365/185.11; 257/320
See application file for complete search history.

(56) References Cited

U.S. PATENT DOCUMENTS

| | | | | |
|---|---|---|---|---|
| 5,229,632 | A * | 7/1993 | Yoshikawa | 257/320 |
| 5,699,298 | A * | 12/1997 | Shiau et al. | 365/185.18 |
| 5,790,456 | A * | 8/1998 | Haddad | 365/185.17 |
| 6,055,190 | A * | 4/2000 | Lu et al. | 365/185.18 |
| 6,628,545 | B1 * | 9/2003 | Li et al. | 365/185.18 |
| 6,654,287 | B2 * | 11/2003 | Visconti | 365/185.29 |
| 6,714,457 | B1 * | 3/2004 | Hsu et al. | 365/185.28 |
| 6,735,125 | B2 * | 5/2004 | Hirano | 365/185.29 |
| 7,009,881 | B2 * | 3/2006 | Noguchi | 365/185.17 |
| 7,180,779 | B2 * | 2/2007 | Telecco et al. | 365/185.18 |
| 7,339,828 | B2 * | 3/2008 | Hasegawa et al. | 365/185.18 |
| 7,633,811 | B2 * | 12/2009 | Fang et al. | 365/185.28 |
| 8,027,196 | B1 * | 9/2011 | Wong | 365/185.17 |
| 2010/0172188 | A1 | 7/2010 | Chen et al. | |

* cited by examiner

*Primary Examiner* — Trong Phan
(74) *Attorney, Agent, or Firm* — Haynes Beffel & Wolfeld LLP

(57) ABSTRACT

Techniques are described herein for detecting and recovering over-erased memory cells in a flash memory device. In one embodiment, a flash memory device includes a memory array including a plurality of blocks of memory cells. The device also includes a command interface to receive a command from a source external to the memory device. The device also includes a controller including logic to perform a leakage-suppression process in response to the command. The leakage-suppression process includes performing a soft program operation to increase a threshold voltage of one or more over-erased memory cells in a given block of memory cells and establish an erased state.

20 Claims, 13 Drawing Sheets

METHOD AND APPARATUS FOR LEAKAGE SUPPRESSION IN FLASH MEMORY IN RESPONSE TO EXTERNAL COMMANDS

CROSS-REFERENCE TO RELATED APPLICATIONS

The present application claims the benefit of U.S. Provisional Application No. 61/475,157, filed 13 Apr. 2011, entitled "Method and Apparatus for Leakage Suppression in Flash Memory," which is incorporated by referenced herein.

The present application is related to U.S. application Ser. No. 13/308,301, filed Nov. 30, 2011.

BACKGROUND

1. Field of the Invention

The present invention relates to flash memory technology, and more particularly to techniques for suppressing leakage in block-based flash memory devices.

2. Description of Related Art

Flash memory includes memory cells that store charge between the channel and gate of a field effect transistor. The charge stored affects the threshold voltage of the transistor. Changes in the threshold voltage due to the stored charge can be sensed to indicate data stored in the memory cell. One type of charge storage cell is known as a floating gate memory cell, which stores charge on an electrically conductive layer between the channel and gate. Another type of charge storage cell is referred to as a charge trapping memory cell, which uses a dielectric layer in place of the floating gate.

A memory cell can be programmed using various biasing techniques such as Fowler Nordheim (FN) tunneling, Channel Hot Electron (CHE), etc. The programming operation increases the threshold voltage of the memory cell.

A memory cell can be erased by applying a bias to induce hole tunneling into the charge storage layer, or to induce electron tunneling from the charge storage layer. The erase operation decreases the threshold voltage of the memory cell.

In a flash memory device, memory cells in an array are grouped into blocks, and memory cells in each block are erased together. Thus, in order to erase a memory cell in a block, all the memory cells in that block must also be erased. Consequently, an erase operation in a flash device is generally a slower process than a program operation.

Flash memory devices can suffer from the problem of over-erasure of the memory cells. When a block of memory cells is erased, some of the memory cells will have a lower threshold voltage than others. Over-erasure occurs if, during the erasing step, too many electrons are removed from the charge storage layer. This can leave a slight positive charge, which biases the memory cell slightly on, such that the memory cell is operating in depletion mode. This results in the memory cell conducting leakage current, even when it is not accessed. A number of over-erased cells along a given bit line can cause an accumulation of leakage current sufficient to cause a false reading of a selected memory cell sharing the same bit line.

For example, in a NOR architecture, drains of a number of memory cells are coupled together to a common bit line. If one or more memory cells has been over-erased, those memory cells will cause leakage current to flow on the common bit line, even when the cell is not directly accessed. During a read operation of a selected memory cell, the leakage current flowing on the common bit line due to the over-erased cell(s) can cause the current on the bit line to be high enough that the selected memory cell falsely appears to be erased.

It is therefore desirable to provide flash memory devices and methods for operating which address the issues caused by over-erased cells.

SUMMARY

Techniques are described herein for suppressing leakage current in a block-based flash memory device by detecting and recovering over-erased memory cells. An over-erased memory cell is a memory cell having a threshold voltage less than a minimum threshold voltage of an erased state.

A leakage-suppression process is carried out by control logic in response to a command received on an external control line via a command interface. The command may be provided by a host computer or other external source. The leakage-suppression process may be a stand-alone process, or embedded within other operations. For example, the leakage-suppression process may be performed during standard block erase operations.

The leakage-suppression process can include applying bias voltages sufficient to turn on over-erased memory cells, in order to identify corresponding bit lines that conduct leakage current. A significant leakage current indicates that the identified bit lines are coupled to one or more over-erased memory cells. A "soft" program operation is then performed to slightly increase the threshold voltage of the over-erased memory cells, thereby correcting the over erasure.

To support this process, erase status data associated with each block of memory cells can be maintained and stored in memory on the device. The erase status data is written to memory following successful completion of the leakage-suppression process on the corresponding block of memory cells. The erase status data can thus be used to quickly determine whether a corresponding block of memory cells may include over-erased memory cells.

In some embodiments, the erase status data is a single bit flag indicating the over-erase status of the corresponding block. The flag is set, for example, prior to beginning the leakage-suppression process on the corresponding block. Upon successful completion of the leakage-suppression process, the flag is then reset to indicate that the block does not contain over-erased memory cells. Thus, the flag indicates whether an interruption, such as power down of the device, occurred prior to completion of the leakage-suppression process. If the flag is set, the control logic executes the leakage suppression process on the corresponding block of memory cells. If the flag is reset, the control logic skips the block without performing the leakage-suppression process.

In other embodiments, the erase status data is a predetermined multi-bit sequence stored within a status field area of the corresponding block of memory cells. The predetermined multi-bit sequence is a pattern of programmed and erased bits written to memory cells in the status field area within the block. The predetermined bit sequence is written to the status field of the block upon erasing the memory cells in the block, but prior to performing the leakage-suppression process.

A difference between the data stored in the status field area and the expected predetermined multi-bit sequence can be used to indicate that the corresponding block may include over-erased memory cells. As a result of the relatively small number of memory cells in the status field area, this determination can be made much more quickly than detecting bit errors within the entire block of memory cells.

Other aspects and advantages of the present invention can be seen on review of the drawings, the detailed description, and the claims which follow.

DETAILED DESCRIPTION

A detailed description of embodiments of the present invention is provided with reference to the FIGS. 1-13.

Figure 1:
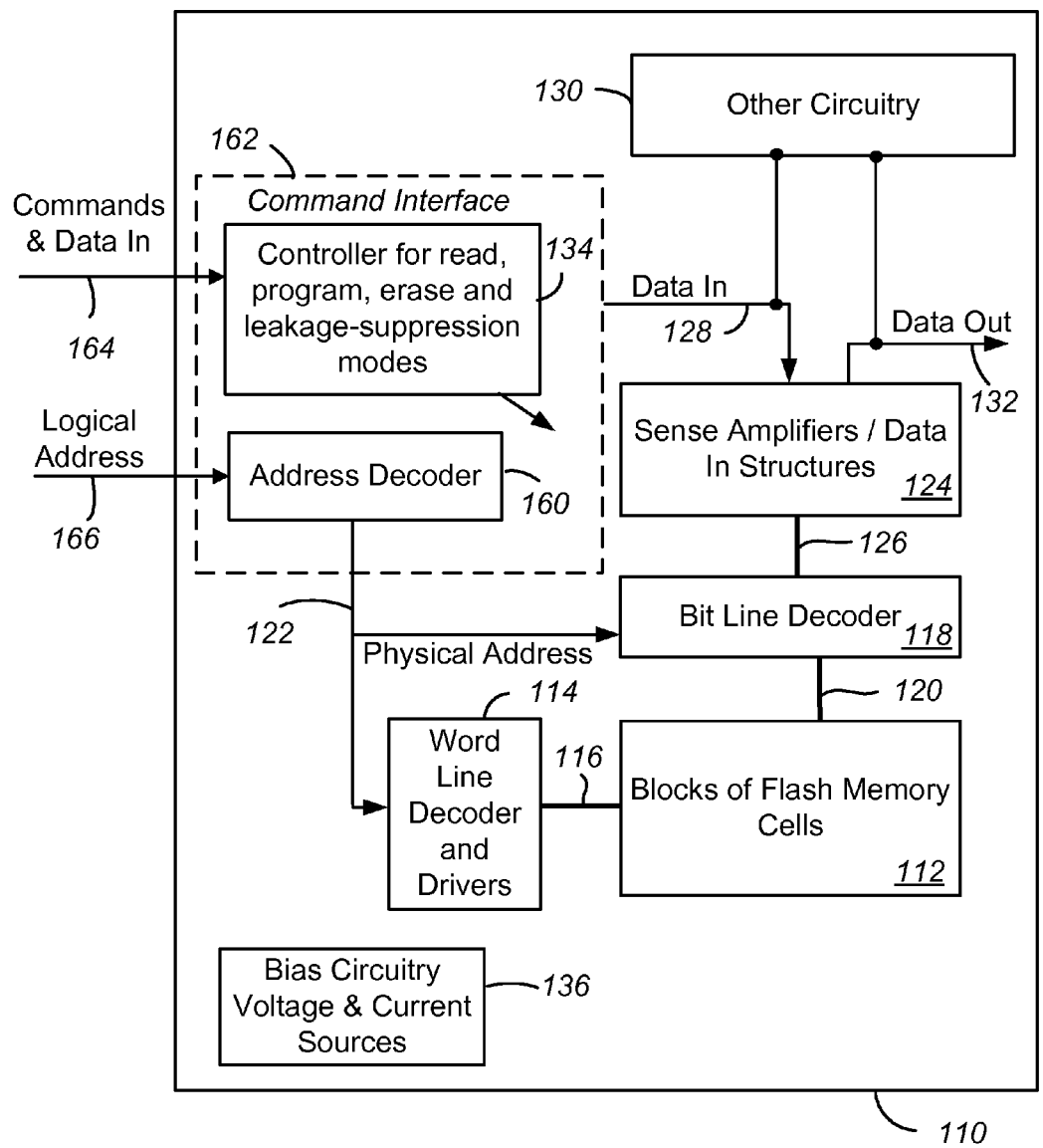
FIG. 1 is a simplified block diagram of a flash memory device including a memory array having bocks of memory cells which can be operated as described herein.

FIG. 1 is a simplified block diagram of a flash memory device 110 including a memory array 112 having bocks of memory cells which can be operated as described herein. A word line decoder 114 is coupled to and in electrical communication with a plurality of word lines 116 arranged along rows in the memory array 112. A bit line (column) decoder 118 is in electrical communication with a plurality of bits lines 120 arranged along columns in the array 112 for reading and writing the memory cells in the memory array 112. Command signals and data for controlling the flash memory device 110 are supplied to a command interface 162 via external line 164. The command interface 162 also receives logical addresses via external line 166. In this example, the data, command signals and logical addresses are specified by an external system, such as a computer, coupled to the flash memory device 110. In some embodiments, the data, command signals and logical addresses are applied on shared lines in a serial fashion.

The command interface 162 includes an address decoder 160 which translates the logical addresses specified by the external system into physical addresses of the memory array 112. In some embodiments, the address decoder 160 may be omitted and the logical to physical address translation can be performed by the word line decoder and drivers 114 and the bit line decoder 118. The physical addresses are supplied on bus 122 to word line decoder and drivers 114 and bit line decoder 118. Sense amplifier and data-in structures 124, including voltage and/or current sources for read, program, erase and leakage-suppression modes are coupled to bit line decoder 118. Data from external line 164 is supplied on data bus 128 by the command interface 162, or from other data sources internal or external to flash memory device 110, to data-in structures in block 124. Other circuitry 130 may be included on the flash memory device 110, such as a general purpose processor or special purpose application circuitry, or a combination of modules providing system-on-a-chip functionality supported by array 112. Data is supplied via a data-out line 132 from the sense amplifiers in block 124 to input/output ports on the flash memory device 110, or to other data destinations internal or external to the flash memory device 110.

A controller 134, implemented in this example as a state machine, includes logic responsive to command data to control the application of bias circuitry voltage and current sources 136 to carry out the various operations described herein. The controller 134 translates command data received via the external line 164 and provides instructions to perform the various operations described herein. Command data may also be provided from other sources internal or external to the flash memory device 110. Controller 134 may be implemented using special-purpose logic circuitry as known in the art. In alternative embodiments, controller 134 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 134.

The flash memory device 110 stores the basic programming and data constructs that provide the functionality of certain embodiments, including instructions for organization of data within the memory array 112. These instructions are generally executed by the controller 134, which may include random access memory (RAM) for storage of instructions and data during program execution.

The memory array 112 includes blocks of flash memory cells which are separately erasable from the other blocks. The block size and number of blocks will vary from embodiment to embodiment. In some embodiments, the size of each of the blocks can be for example 2 KB, 4 KB, 8 KB, or 16 KB. Each of the blocks can include one or more sectors. For example, a 4 KB block can include 128 32-byte sectors. The terms "sector" and "block" are used herein to refer to sets of memory cells. These terms do not refer necessarily to sets of data cells that correspond strictly with a physical segmentation of the memory array 112, although it may be advantageous to consider any such physical segmentation in the allocation of blocks and sectors for the purposes described herein.

The term "program" as used herein refers to an operation which can be carried out in flash memory on a cell-by-cell basis, while the term "erase" refers to an operation which, due to the configuration of the flash memory cells, is carried out in flash memory on a larger basis, on boundaries that are efficiently enforced for a given array structure. Further, the term "write" as used herein describes an operation which changes the threshold voltage of a selected memory cell, and is intended to encompass both program and erase.

For clarity purposes, the term "program" as used herein refers to an operation which increases the threshold voltage of a memory cell. The data stored in a programmed memory cell is represented as a logical "0" in the examples described herein. The term "erase" as used herein refers to an operation which decreases the threshold voltage of a memory cell. The data stored in an erased memory cell is represented as a logical "1" in the examples described herein.

Figure 2:
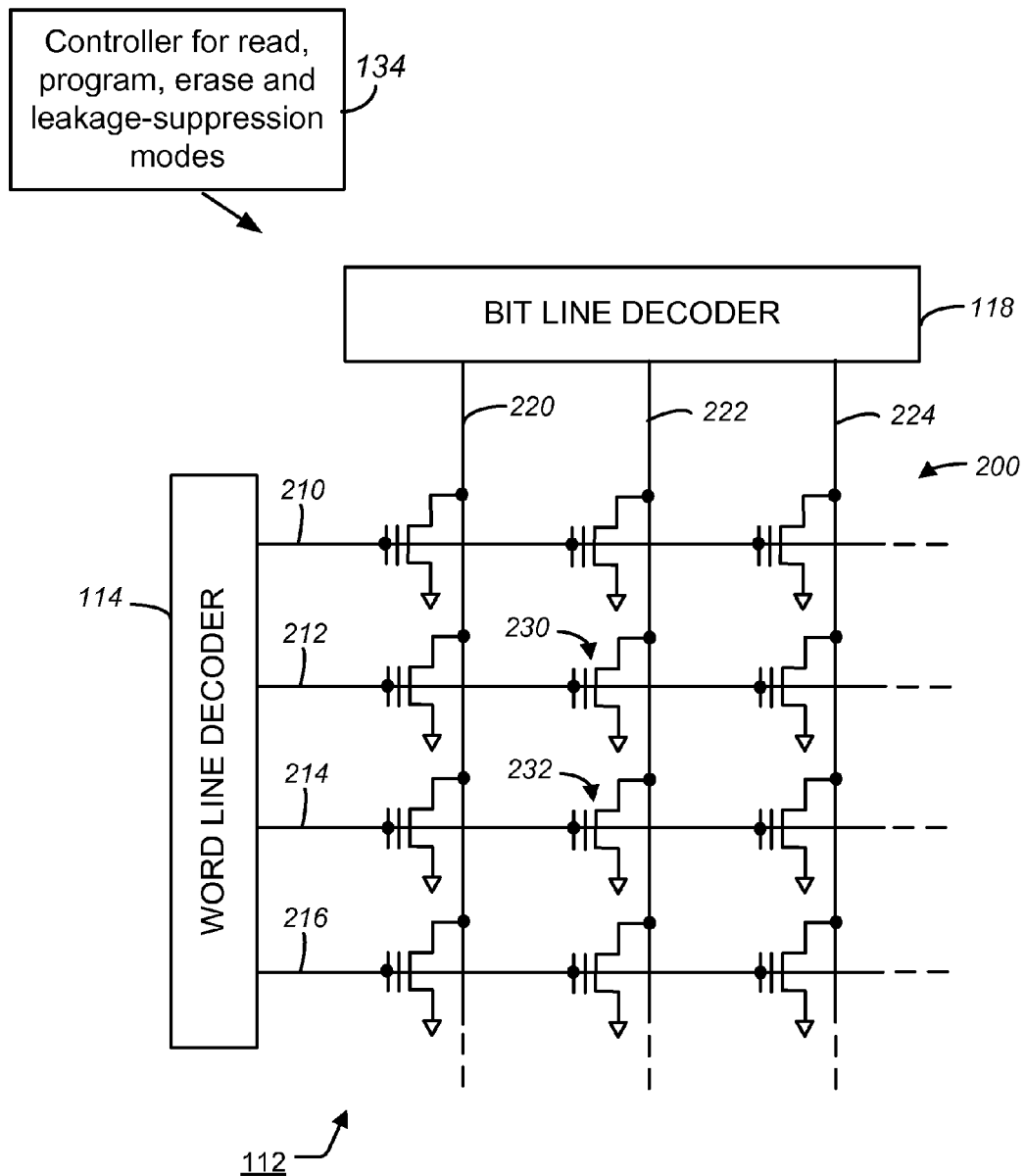
FIG. 2 illustrates an example of a portion of a block of memory cells in the memory array of FIG. 1.

FIG. 2 illustrates an example of a portion of a block 200 memory cells in the memory array 112 of FIG. 1. In FIG. 2, the memory cells are arranged in a NOR configuration. Other array configurations can alternatively be used. In the illustrated example, twelve memory cells are illustrated, representing a small section of the block 200 that can include thousands of memory cells.

A plurality of word lines including word lines 210, 212, 214, 216 extend in parallel along a first direction. The word lines are connected to the gates of the memory cells. The word lines are in electrical communication with word line decoder 114.

A plurality of bit lines including bit lines 220, 222, 224 extend in parallel in a second direction. The bit lines are in electrical communication with bit line decoder 118. As shown in FIG. 2, each of the bit lines is connected to the drains of memory cells arranged along a column of the array 112. The sources of each of the memory cells are connected to ground in this example. In another embodiment, the sources of the memory cells are coupled to bias circuitry to apply bias arrangements other than ground, which may provide independent control the sources.

In operation, each of the memory cells store a data value depending upon their threshold voltage. Reading or writing a selected memory cell can be achieved by applying appropriate voltages to the corresponding word lines and corresponding bit lines.

During a programming operation, appropriate voltages are applied to the bit line and word line of a selected memory cell to induce a tunneling of electrons into the charge storage layer. The programming operation increases the threshold voltage of the memory cell. The selected memory cell may be programmed using one of a number of well-known biasing techniques such Fowler Nordheim (FN) tunneling, Channel Hot Electron (CHE), etc.

The memory cells in the block 200 can be erased by applying a voltage differential between the gate and the channel to induce hole tunneling into the respective charge storage layers, or to induce electron tunneling from the charge storage layer. The erase operation decreases the threshold voltage of each of the memory cells in the block 200.

In a read operation, appropriate read voltages are applied to the bit lines and word lines, so that the current flowing through a selected memory cell can be sensed. The data value may be determined by sensing the amount current flowing on the bit line of the selected memory cell during the read operation. The read voltages may be selected such that an erased memory cell turns on (i.e. conducts current) during the read operation, while a programmed memory cell remains off (i.e. conducts very little to no current).

The data value may be determined, for example, by comparison of current on the bit line of the selected memory cell to that of a read reference current. However, read errors can occur due to leakage current caused by one or more over-erased memory cells along the same bit line. Over-erasure occurs if, during the erasing step, too many electrons are removed from the charge storage layer of a memory cell, leaving the memory cell with a threshold voltage less than a minimum threshold voltage (e.g. zero Volts) for the erased state. This can leave a slight positive charge on the charge storage layer, which biases the memory cell slightly on, such that the memory cell is operating in depletion mode. This results in a small current leaking through the over-erased cell, and thus on the corresponding bit line, even when it is not addressed.

For example, if memory cell 232 is over-erased, leakage current will flow on bit line 222 and through the memory cell 232, even when the memory cell 232 is not directly addressed. During a read operation of a programmed memory cell 230, the leakage current flowing on the bit line 222 due to the over-erased memory cell 232 can cause the selected memory cell 230 to falsely appear to be erased, resulting in a bit error.

Techniques are described herein for suppressing leakage current by detecting and recovering over-erased memory cells in a flash memory device.

Figure 3:
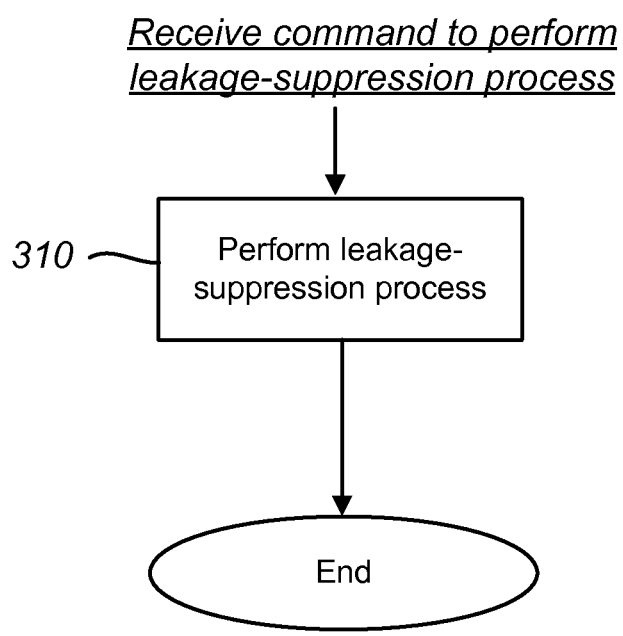
FIG. 3 is a flow diagram of a leakage-suppression process for detecting and recovering over-erased memory cells.

FIG. 3 is a flow diagram of an operation 300 which can be executed by the controller 135 to perform a leakage-suppression process to detect and recover over-erased memory cells.

In response to a command received on the external line 164 from a source external to the flash memory device 110, at step 310 the leakage-suppression process is performed. The command may be provided from a host computer or other external source.

Step 310 includes determining that a given block of memory cells includes one or more over-erased memory cells based on leakage current on bit lines coupled to memory cells in the block. The detection of leakage current is described in more detail below with reference to FIG. 4

Step 310 also includes performing a "soft" programming operation upon determination that the block includes over-erased memory cells. The soft programming operation includes applying appropriate bias voltages to slightly increase the threshold voltage of the over-erased cell(s), thereby recovering those cells. The soft programming operation is described in more detail below with reference to FIG. 4.

In this example, the leakage-suppression process is performed in response to a command received from an external source. Alternatively, the leakage-suppression process may be carried out in response to a command generated internal to the flash memory device 110. For example, in some embodiments the controller 134 may include logic to generate a leakage-suppression command in response to an initialization event. The initialization event may be a power-up event of the flash memory device 110. More generally, the initialization event may be any other event that may indicate that over-erased memory cells may be present.

The operation 300 may be a stand alone leakage suppression process, or may be embedded within other operations. The operation 300 may be carried out, for example, upon power on of the flash memory device 110, or in response to command data received from sources external or internal to the device 110. The operation 300 may for example be performed directly after power on of the flash memory device 110.

The leakage-suppression process may also be carried out in conjunction with stored erase status data associated with the blocks of memory cells. This is described in more detail below with reference to FIGS. 7-9.

Figure 4:
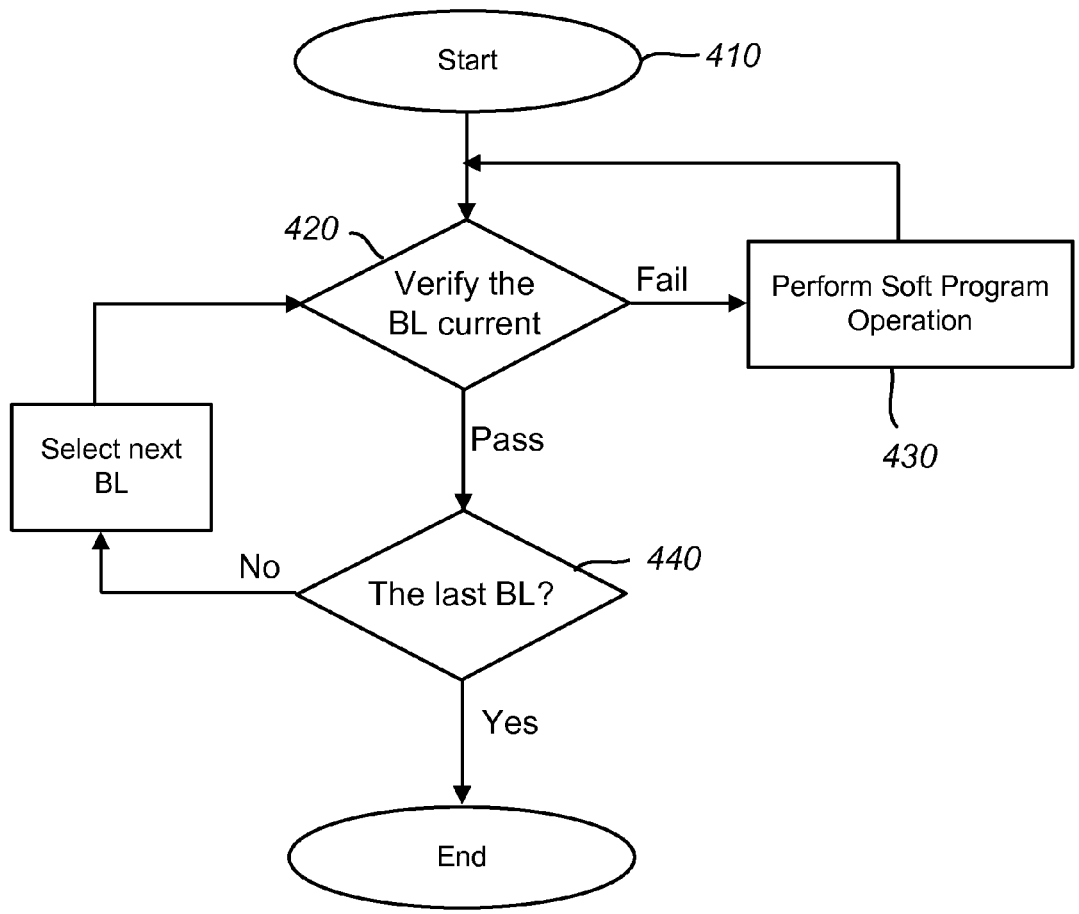
FIG. 4 is a flow diagram of a first example of the leakage-suppression process of FIG. 3

FIG. 4 is a flow diagram of a first operation 400 which can be executed by the controller 134 to perform the leakage-suppression process of FIG. 3. The operation 400 begins at step 410.

At step 420, appropriate bias voltages are applied to the word lines coupled to the gates of the memory cells in the given blocks, and the current on a selected bit line is read. The bias voltages applied to the word lines are sufficient to turn on the over-erased memory cells which may be coupled to the selected bit line, but not turn on memory cells which are properly in an erased or programmed state. If the current on the selected bit line is above a leakage reference current value, the bit line is coupled to one or more over-erased cells, and the operation 400 continues to step 430.

In some embodiments, the same bias voltage is applied concurrently to the word lines of each of the memory cells coupled to the selected bit line. In other words, each of the over-erased memory cells coupled to the selected bit line will turn-on at the same time, and the total current through all of the over-erased memory cells is read.

In other embodiments, the determination of whether over-erased memory cells are coupled to the selected bit line is performed by identifying over-erased memory cells on a cell-by-cell basis. In such a case, a first bias voltage is applied to the word line of the selected memory cell, and a second bias voltage is applied to the word lines of the unselected memory cells. The first bias voltage (e.g. 2 to 3 Volts) is sufficient to turn on the selected memory cell if it is over-erased, but not turn it on if it is properly in an erased or programmed state. The second bias voltage (e.g. −3 to 0 Volts) is insufficient to turn-on the unselected memory cells, even if an unselected memory cell is over-erased, including memory cells having a threshold voltage greater than or equal to a minimum threshold voltage for an erased state.

At step 430, the soft program operation is performed by applying appropriate bias voltages to the word lines and the selected bit line to slightly increase the threshold voltage of the over-erased cell(s), thereby recovering those cells. In some embodiments in which the over-erased memory cells are individually identified, the soft program operation is performed on only the over-erased memory cells.

The soft program operation may for example include applying a voltage of between 0 and 4 Volts to the word line of an over-erased cell, and applying a voltage of greater than 2 Volts to the bit line of the over-erased cell. In one embodiment, positive voltages are applied to both the word line and bit line of the over-erased cell. In another embodiment, ground (0 Volts) is applied to the word line, and a positive voltage is applied to the bit line of the over-erased cell. Alternatively, the soft program operation is performed on each of the memory cells coupled to the selected bit line.

Following the soft program operation, the operation 400 then continues back to step 420 to verify that the over-erasure has been corrected.

If, at step 420 the current on the selected bit line is below the leakage reference current value, no over-erased cells are coupled to the selected bit line. The process then continues to step 440. The operation 400 then continues in the loop of steps 420, 430, 440 to check the current on the next bit line in the flash memory device 110 and correct over-erasure, until all the bit lines have been checked.

Figure 5:
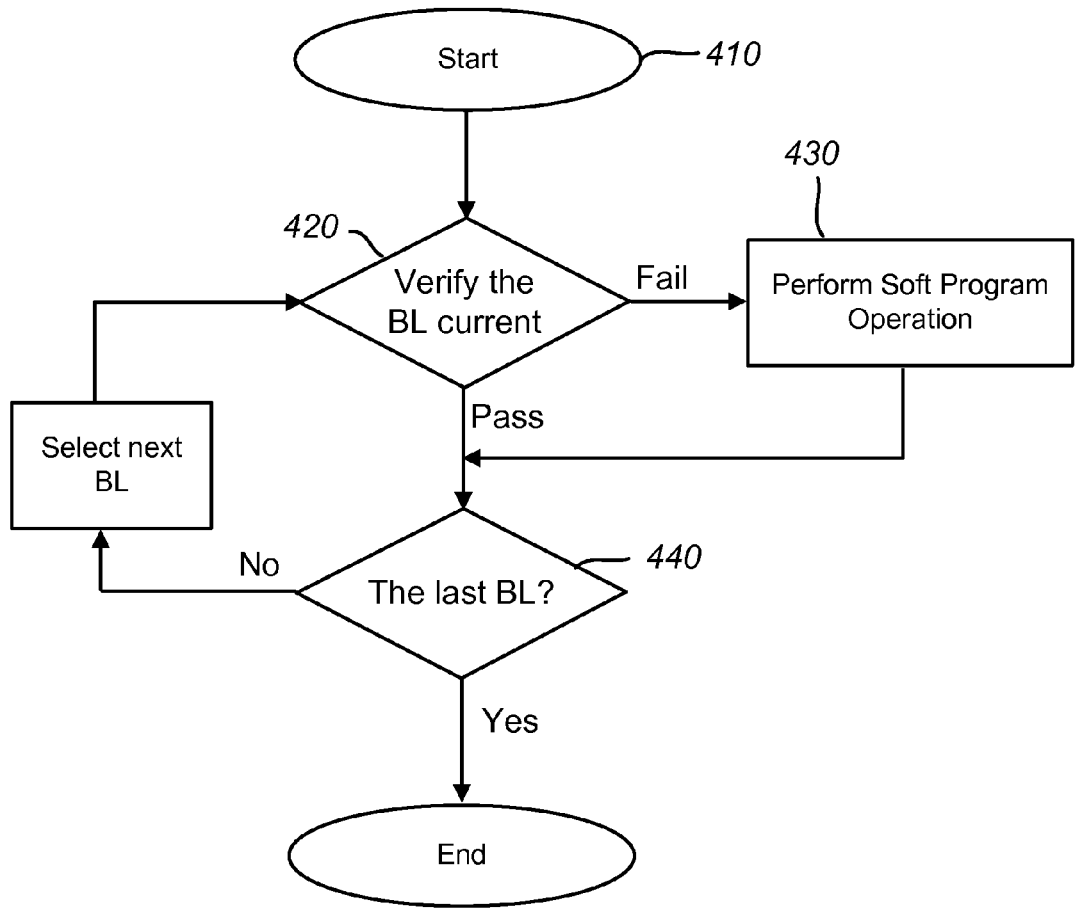
FIG. 5 is a flow diagram of a second example of the leakage-suppression process of FIG. 3.

FIG. 5 is a flow diagram of a second operation 500 which can be executed by the controller 134 to perform the leakage-suppression process of FIG. 3. In FIG. 5, the operation 500 continues to step 440 following the soft program operation of step 430, rather than returning to step 420 as was done for operation 400 in FIG. 4.

Figure 6:
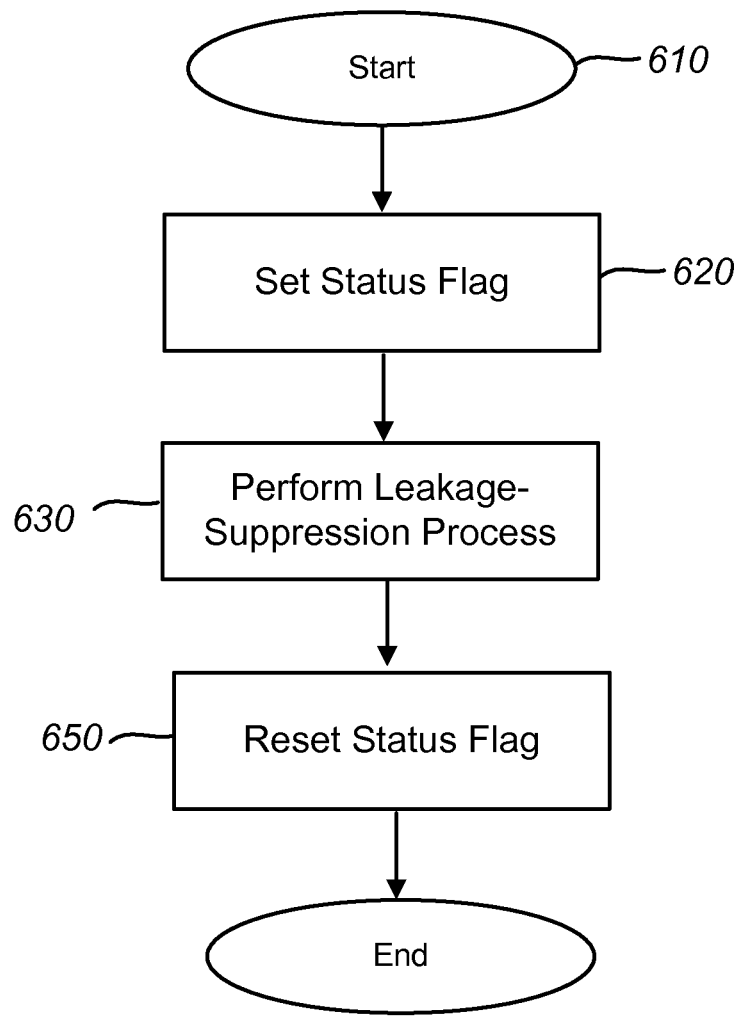
FIG. 6 is a flow diagram for performing a leakage-suppression process that includes the setting and resetting of a single bit flag.

FIG. 6 is a flow diagram of an operation 600 which can be executed by the controller 134 to perform a leakage-suppression process that includes the setting and resetting of a single bit flag.

The operation 600 begins at step 610. At step 620, a single bit flag indicating the over-erase status of a selected block is set. Setting the flag may include writing a bit of data to a particular address in the memory array 112, or to other memory on the flash memory device 110.

At step 630, the leakage-suppression process is performed. Following the successful completion of step 630, the data in the status flag is reset (step 650). The operation 600 then ends.

Figure 7:
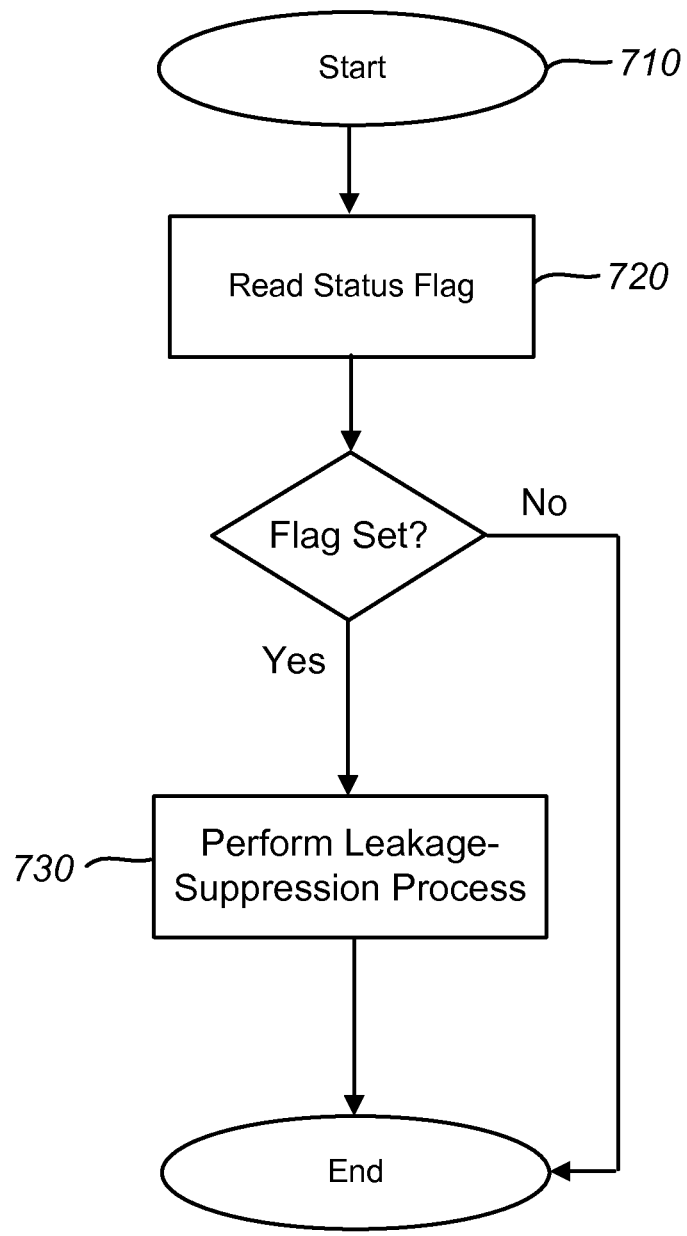
FIG. 7 is a flow diagram of an operation for determining whether to perform the leakage-suppression process.

By changing the data of the status flag in this manner, the status flag can be used to determine whether an interruption, such as power down, occurred prior to completion of the leakage-suppression process. In other words, the status flag can be used to determine whether the block may include over-erased memory cells FIG. 7 is a flow diagram of an operation 700 for determining whether to perform the leakage-suppression process on a given block of memory cells. The operation 700 may be carried out, for example, upon power on of the flash memory device 110, or in response to command data received from sources external or internal to the device 110. The operation 700 may for example be performed directly after power on of the flash memory device 110.

The operation 700 begins at step 710. As step 720, the status flag of the block is read. If the flag has been set, an interruption occurred prior to completion of the operation 600. In such a case, the operation continues to step 730. At step 730 the leakage-suppression process is performed on the block.

If the flag has been reset, the operation 700 skips the leakage-suppression process of step 730.

Figure 8:
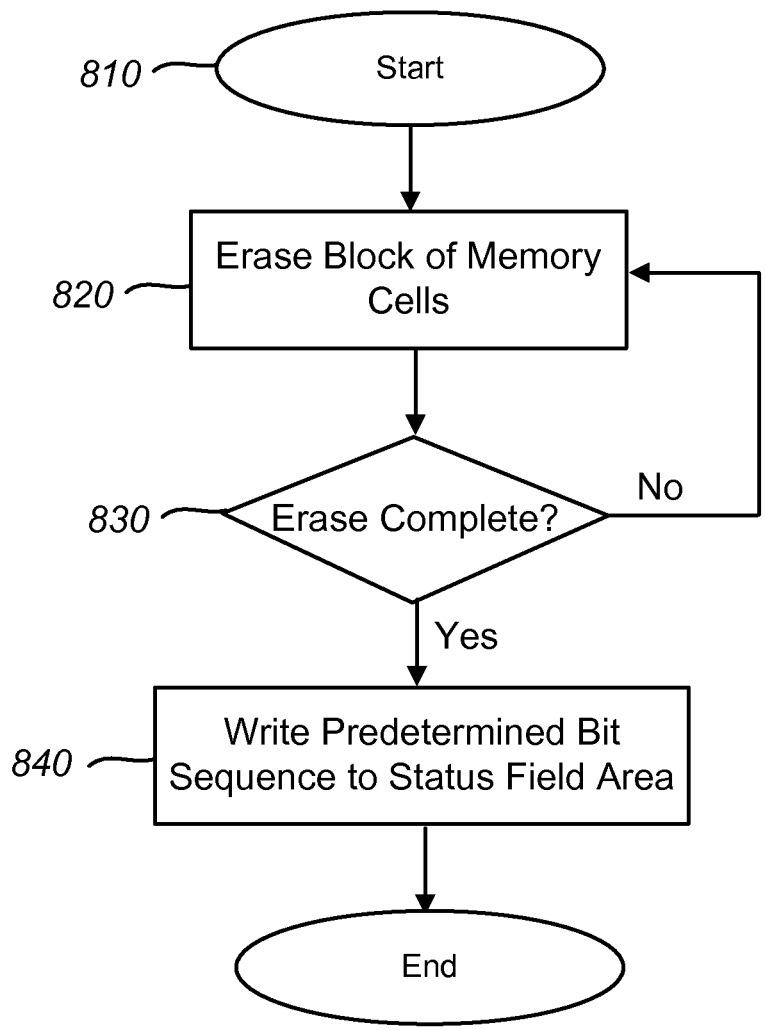
FIG. 8 is a flow diagram of an erase operation that includes writing a predetermined bit-sequence upon erasing the memory cells in the block.

FIG. 8 is a flow diagram of an erase operation 800 that includes writing a predetermined bit-sequence upon erasing the memory cells in the block.

The erase operation 800 begins at step 810. The erase operation 800 may be carried out, for example, upon power on of the flash memory device 110, or in response to command data received from sources external or internal to the device 110. At step 820 the block of memory cells are erased, and the process waits for the block of memory cells to be complete at step 830. The erase operation 820 includes a leakage-suppression process as described herein.

Following the successful completion of the erase process, a predetermined bit sequence is written to a status field area within the block (step 840). The predetermined bit sequence is a pattern of programmed and erased memory cells within the status field area of the block. By writing the predetermined bit sequence in this manner, the predetermined bit sequence can used to determine whether an interruption, such as power down, occurred during the erase operation 800.

Figure 9:
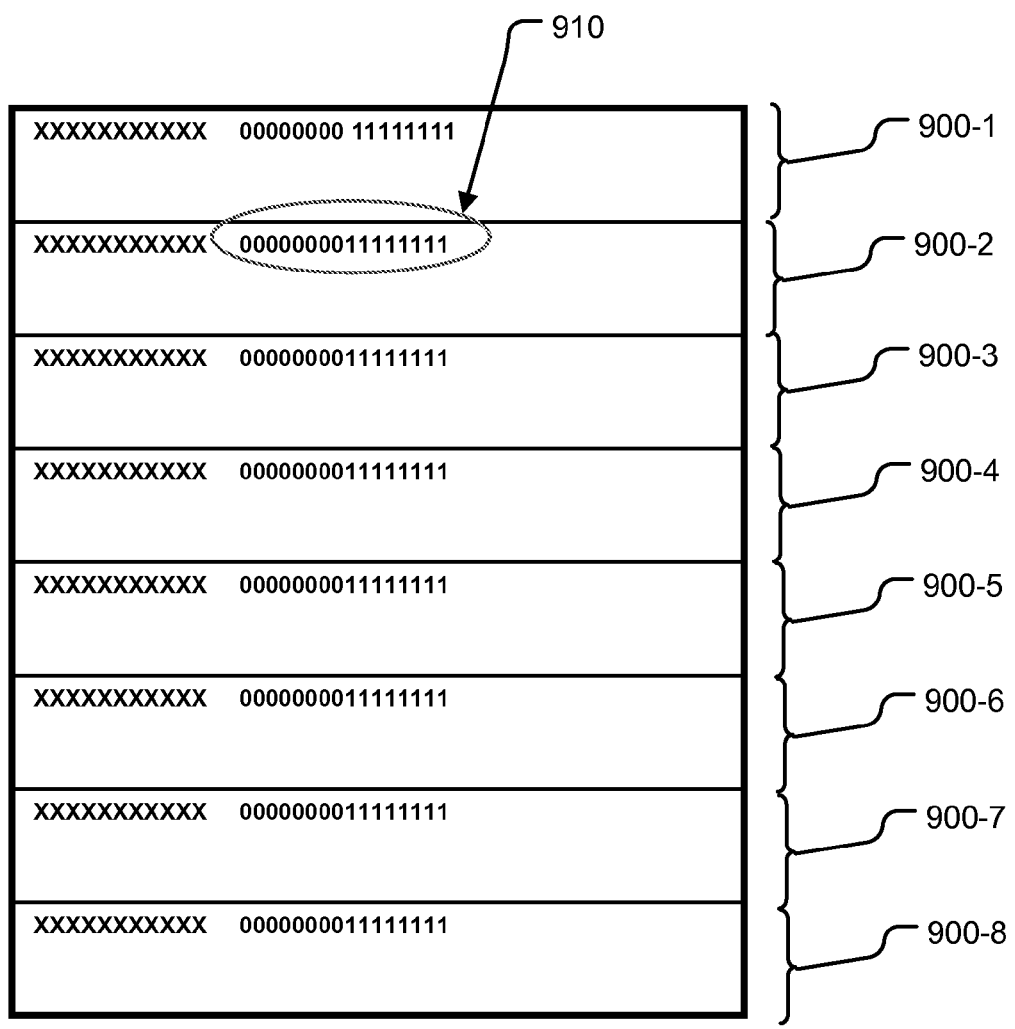
FIG. 9 illustrates an example arrangement of data within blocks of memory cells which include a status field area.

FIG. 9 illustrates an example arrangement of data within blocks 900-1 to 900-8 of memory cells which include status field area. Block 900-2 is representative of the blocks 900. Block 900-2 includes a status field area 910 storing the predetermined bit sequence. In the illustrated example memory cells within the status field area 910 store the predetermined bit sequence as a series of 8 logical "0's" followed by 8 logical "1's". Alternatively, other predetermined bit sequences may be used. In this example, the memory cell in the status field area of one block (e.g. 900-2) is in the same column as the memory cell in the status field area of another block (e.g. 900-3).

Figure 10:
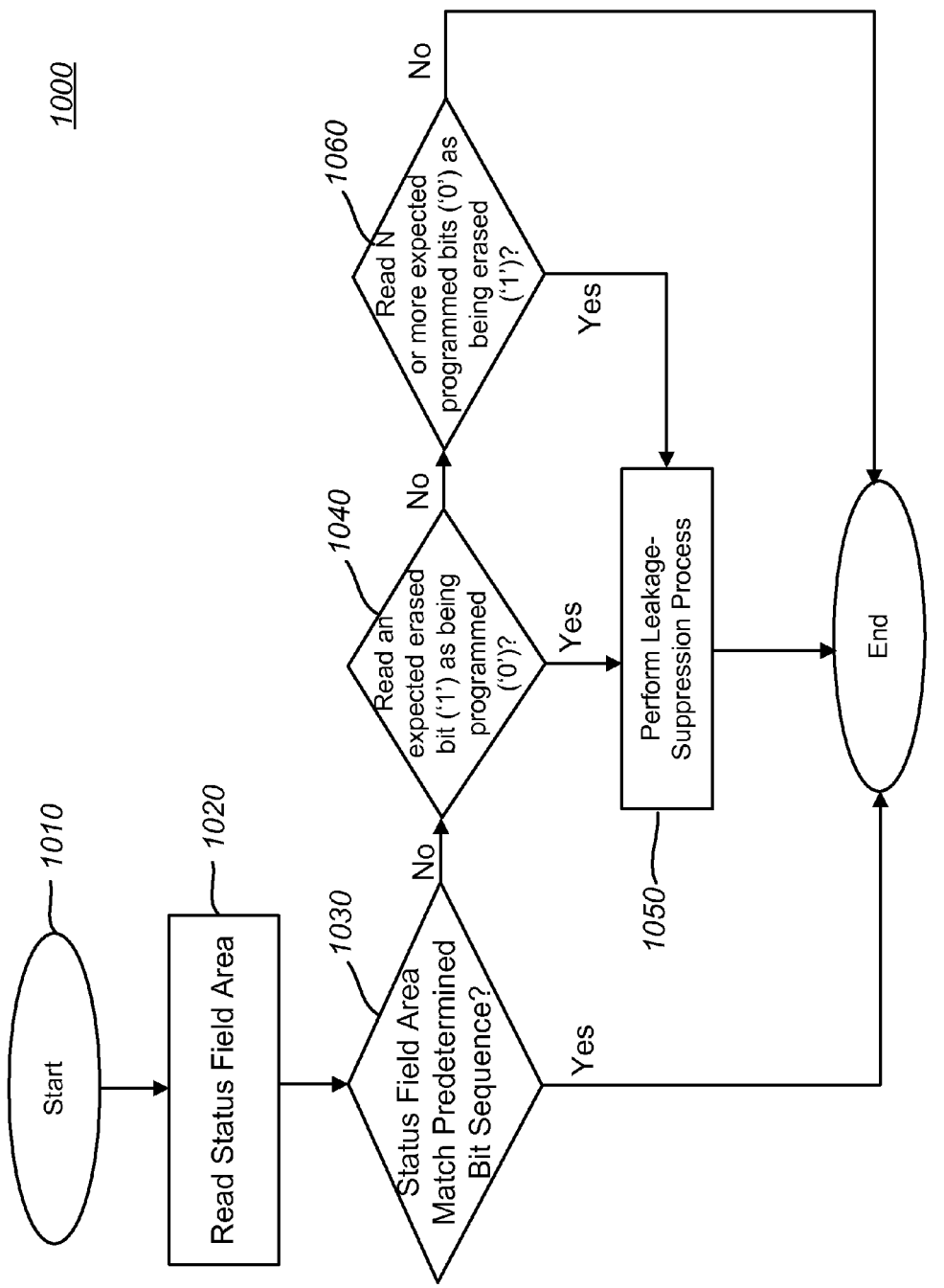
FIG. 10 illustrates a flow diagram of an operation for determining whether an interruption occurred during the erase operation of FIG. 8.

FIG. 10 is a flow diagram of an operation 1000 which can be executed by the controller 134 to determine whether an interruption occurred during the erase operation 800 of FIG. 8. The operation 1000 may be carried out, for example, upon power on of the flash memory device 110, or in response to command data received from sources external or internal to the device 110.

FIG. 10 begins at step 1010. At step 1020, the data stored in the status field area of the block is read. If the data read from the status field area matches the expected bit sequence (step 1030), the erase operation 800 of the block has been successfully completed and the operation 1000 ends.

As described below, differences between the data stored in the status field area and the expected bit sequence can be used to indicate whether to perform a leakage-suppression process. In other words, the differences can be used to determine whether an interruption occurred prior to completing the erase operation of the memory cells in the block.

Figure 11:
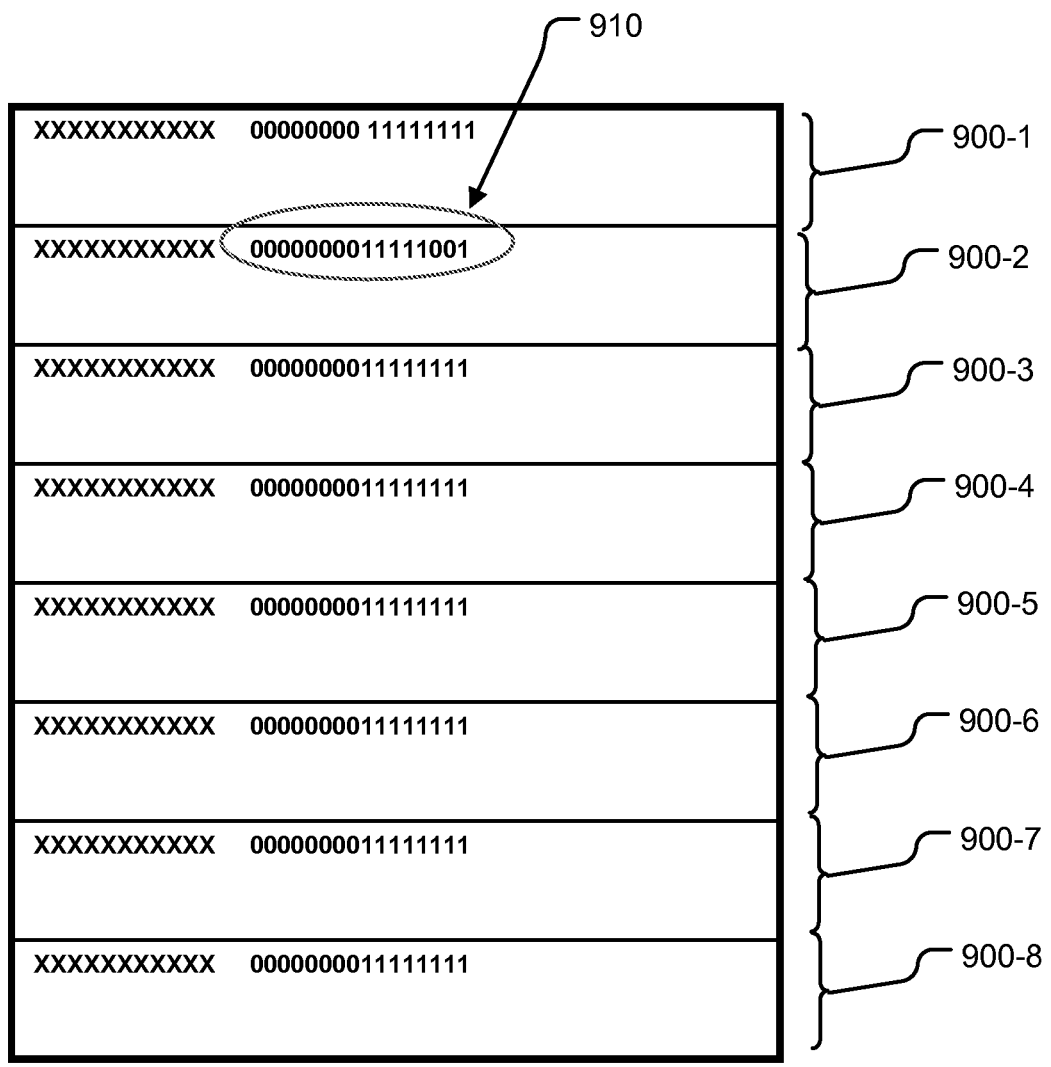
FIG. 11 illustrates an example in which two bits within the status field area of a given block are read as being in the programmed state, while the expected bit sequence specifies that these bits should be in the erased state.

If the data read from the status field area does not match the expected bit sequence, the operation continues to step 1040. If the expected bit sequence specifies that a bit in the status field area should be in the erased state, when in fact the bit is read as being in the programmed state (step 1040), the erase operation was interrupted prior to completing the erase operation of the given block of memory cells. This is because an over-erased memory cell will not cause an erased memory cell to erroneously be read as being in the programmed state. FIG. 11 illustrates an example in which two bits within the status field area 910 are read as being in the programmed state, while the expected bit sequence specifies that these memory cells should be in the erased state.

Referring back to FIG. 10, if one or more bits expected to be erased bits are instead read as programmed bits, the operation continues to step 1050. As step 1050, the leakage-suppression process is performed on the memory cells in the block of memory cells. The operation then ends.

If, at step 1040, none of the erased bits within the status field area are read as programmed bits, the operation continues to step 1060. At step 1060, the read data is compared to the expected bit sequence to determine the number of bits that should be in the programmed state, but are in fact read as being in the erased state. If a relatively small number, for example 1 or 2, of the bits should be in the programmed state, but are read as being in the erased state, this may be due to leakage current caused by one or more over-erased memory cells in another block but that share the same column. In other words, a relatively small number of incorrect bits less than a predetermined number may indicate that the memory cells in the block were successfully erased, but the erase operation was not completed for another block of memory cells. In such a case, the process skips the leakage-suppression process and ends.

Figure 12:
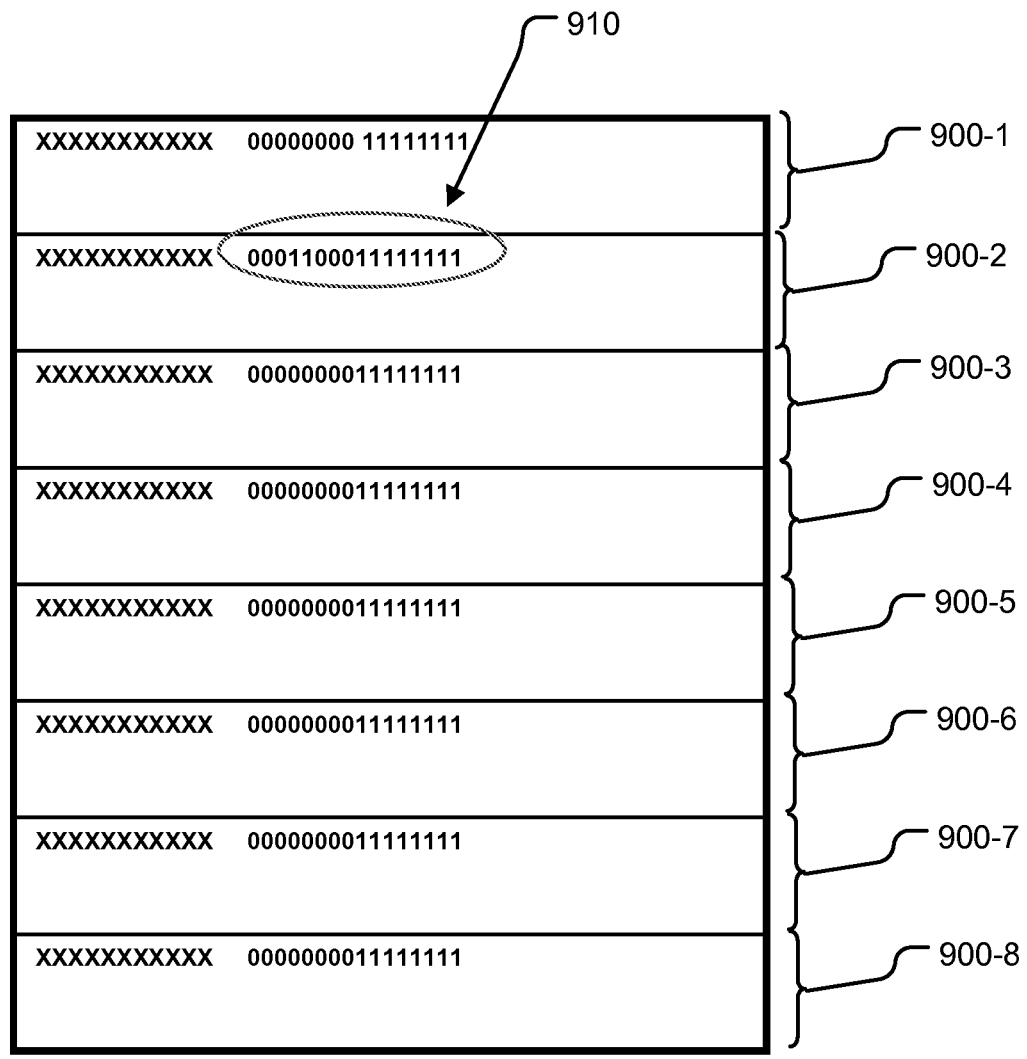
FIG. 12 illustrates an example in which two bits within the status field area of a given block are read as being in the erased state, while the expected bit sequence specifies that these memory cells should be in the programmed state.

FIG. 12 illustrates an example in which two bits within the status field area are read as being in the erased state, while the expected bit sequence specifies that these bits are in the programmed state.

Referring back to FIG. 10, if at step 1060, N or more bits should be in the programmed state but are read as being erased, this is an indication that the erase operation was interrupted prior to erasing each of the memory cells in the given block. In such a case, the operation 1000 continues to step 1050.

Figure 13:
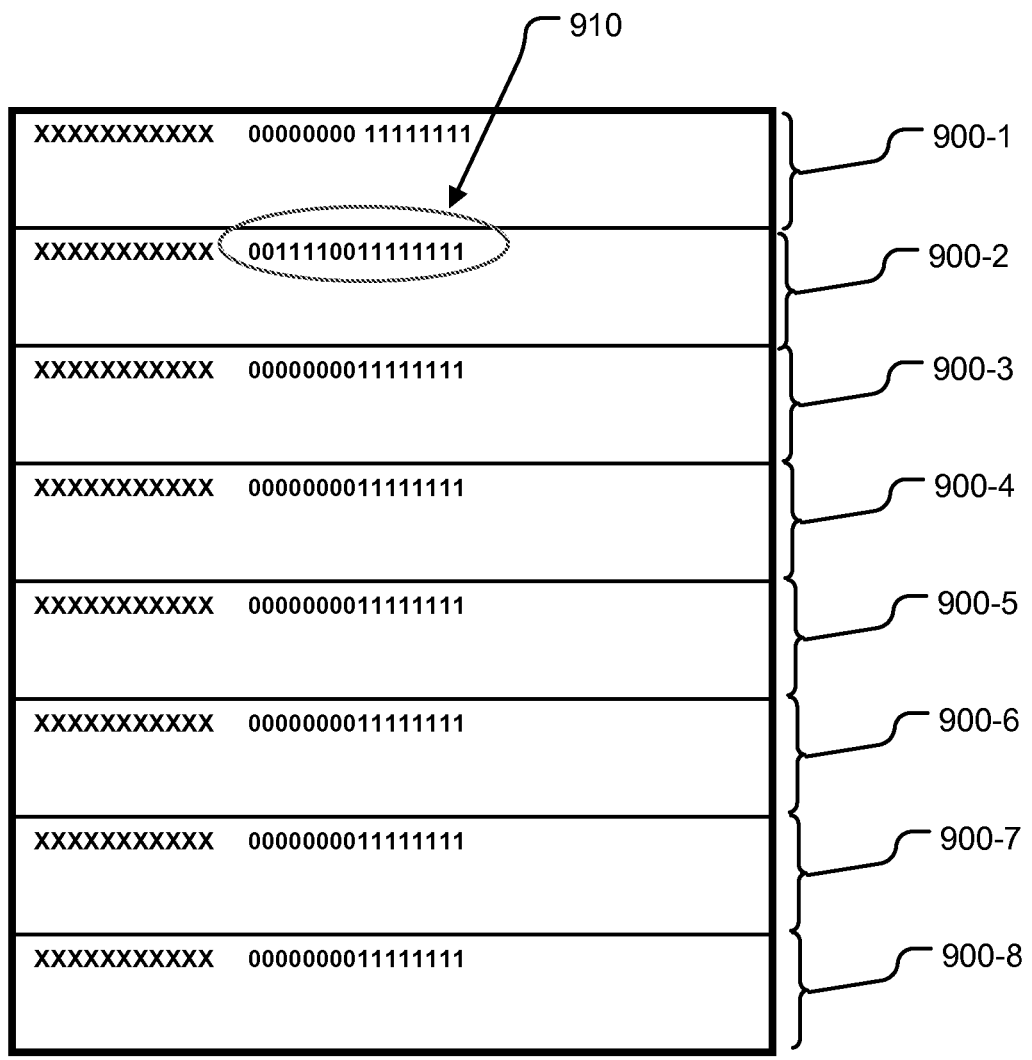
FIG. 13 illustrates an example in which four bits within the status field area are read as being in the erased state, while the expected bit sequence specifies that these memory cells should be in the programmed state.

FIG. 13 illustrates an example in which four bits within the status field area are read as being in the erased state, while the expected bit sequence specifies that these bits should be in the programmed state.

As a result of the relatively small number of memory cells in the status field area, the determination of whether or not an over-erased memory cell may be present can be made much more quickly than detecting bit errors within the entire block of memory cells. Additionally, the complexity of control and sensing circuits needed to detect an over-erased cell is greatly simplified.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A flash memory device comprising:
a memory array including a plurality of blocks of memory cells wherein the memory array includes word lines and bit lines coupled to corresponding memory cells in the given block of memory cells; and
a controller including logic to perform a leakage-suppression process in response to the command, the leakage-suppression process comprising:
after determining that a given block of memory cells includes one or more over-erased memory cells, performing a soft program operation to increase a threshold voltage of one or more over-erased memory cells in the given block of memory cells,
the determining step comprises applying bias voltages to the word lines sufficient to turn on the over-erased memory cells, and comparing current on the corresponding bit lines to a reference to identify bit lines that are coupled to over-erased memory cells; and
performing the soft program operation comprises performing the soft program operation on memory cells that are coupled to the identified bit lines to increase the threshold voltage of the over-erased memory cells and establish the erased state.

2. The memory device of claim 1, wherein the bias voltages applied to the word lines are insufficient to turn on memory cells having a threshold voltage greater than or equal to a minimum threshold voltage for an erased state.

3. A flash memory device comprising:
a memory array including a plurality of blocks of memory cells;
a command interface to receive a command from a source external to the memory device; and
a controller including logic to perform a leakage-suppression process in response to the command, the leakage-suppression process comprising:
after determining that a given block of memory cells includes one or more over-erased memory cells, performing a soft program operation to increase a threshold voltage of one or more over-erased memory cells in the given block of memory cells, wherein the leakage-suppression process further comprises writing status data in memory associated with the given block of memory cells after applying the soft program bias arrangement, the status data indicating that the given block does not contain over-erased memory cells.

4. A flash memory device comprising:
a memory array including a plurality of blocks of memory cells;
a command interface to receive a command from a source external to the memory device; and
a controller including logic to perform a leakage-suppression process in response to the command, the leakage-suppression process comprising:
after determining that a given block of memory cells includes one or more over-erased memory cells, performing a soft program operation to increase a threshold voltage of one or more over-erased memory cells in the given block of memory cells, wherein:
the memory device includes memory storing erase status data associated with corresponding blocks of memory cells; and the determining that the given block of memory cells includes over-erased memory cells if there is a difference between the stored erase status data associated with the given block of memory cells and expected erase status data, and performing the soft program operation upon said determination.

5. The memory device of claim 4, wherein the difference indicates that an interruption occurred prior to completion of a previous leakage suppression process.

6. The memory device of claim 5, wherein the previous leakage suppression process is part of a previous erase operation performed on the given block of memory cells, and the difference indicates than an interruption occurred prior to completion of the previous erase operation.

7. The memory device of claim 4, wherein the status data is a single bit.

8. The memory device of claim 4, wherein:
the status data is a multi-bit sequence stored in a status field area of the given block of memory cells;
the leakage-suppression process further comprises:
reading the multi-bit sequence stored in the status field area of the given block of memory cells;
determining that the given block of memory cells includes over-erased memory cells if a number of programmed bits in the stored multi-bit sequence that correspond to erased bits in an expected multi-bit sequence is greater than one and less than a predetermined number; and
the controller further includes logic to perform the leakage-suppression process on the given block of memory cells if the number of programmed bits in the stored multi-bit sequence that correspond to erased bits in the expected multi-bit sequence is greater than the predetermined number.

9. The memory device of claim 8, wherein the controller further includes logic to perform the leakage-suppression process on the given block of memory cells if one or more erased bits in the stored multi-bit sequence correspond to programmed bits in the expected multi-bit sequence.

10. The memory device of claim 8, wherein the received command is an erase command to perform an erase operation, and the controller includes logic to erase the block of memory cells in response to the erase command prior to performing the leakage-suppression process.

11. A method for operating a flash memory device, the memory device comprising a memory array including a plurality of blocks of memory cells, the method comprising:
receiving a command from a source external to the memory device; and
performing a leakage-suppression process in response to the command, the leakage-suppression process comprising:
after determining that a given block of memory cells includes one or more over-erased memory cells, performing a soft program operation to increase a threshold voltage of one or more over-erased memory cells in a given block of memory cells, wherein:
the determining step comprises applying bias voltages to words lines coupled to corresponding memory cells in the given block of memory cells, the bias voltages sufficient to turn on the over-erased memory cells, and comparing current on bit lines coupled to the corresponding memory cells to identify bit lines that are coupled to over-erased memory cells; and
performing the soft program operation comprises performing the soft program operation on memory cells that are coupled to the identified bit lines to increase the threshold voltage of the over-erased memory cells and establish the erased state.

12. The method of claim 11, wherein the bias voltages applied to the word lines are insufficient to turn on memory cells having a threshold voltage greater than or equal to a minimum threshold voltage for an erased state.

13. The method of claim 11, wherein the determining that the given block of memory cells includes over-erased memory cells if there is a difference between erase status data stored in memory associated with the given block of memory cells and expected erase status data, and performing the soft program operation upon said determination.

14. The method of claim 13, wherein the difference indicates that an interruption occurred prior to completion of a previous leakage suppression process.

15. The method of claim 14, wherein the previous leakage suppression process is part of a previous erase operation performed on the given block of memory cells, and the difference indicates than an interruption occurred prior to completion of the previous erase operation.

16. The method of claim 13, wherein the status data is a single bit.

17. The method of claim 13, wherein:
the status data is a multi-bit sequence stored in a status field area of the given block of memory cells;
the leakage-suppression process further comprises:
reading the multi-bit sequence stored in the status field area of the given block of memory cells;
determining that the given block of memory cells includes over-erased memory cells if a number of programmed bits in the stored multi-bit sequence that correspond to erased bits in an expected multi-bit sequence is greater than one and less than a predetermined number; and
the method further comprises performing the leakage-suppression process on the given block of memory cells if the number of programmed bits in the stored multi-bit sequence that correspond to erased bits in the expected multi-bit sequence is greater than the predetermined number.

18. The method of claim 11, wherein the received command is an erase command to perform an erase operation, and the method further comprises erasing the block of memory cells in response to the erase command prior to performing the leakage-suppression process.

19. A method for operating a flash memory device, the memory device comprising a memory array including a plurality of blocks of memory cells, the method comprising:
receiving a command from a source external to the memory device; and
performing a leakage-suppression process in response to the command, the leakage-suppression process comprising:
performing a soft program operation to increase a threshold voltage of one or more over-erased memory cells in a given block of memory cells, wherein the leakage-suppression process further comprises writing status data in memory associated with the given block of memory cells after applying the soft program bias arrangement, the status data indicating that the given block does not contain over-erased memory cells.

20. The method of claim 19, further comprising performing the leakage-suppression process on the given block of memory cells if one or more erased bits in the stored multi-bit sequence correspond to programmed bits in the expected multi-bit sequence.

* * * * *